(12) United States Patent
Kocon et al.

(10) Patent No.: US 8,928,075 B2
(45) Date of Patent: Jan. 6, 2015

(54) POWER INTEGRATED CIRCUIT INCLUDING SERIES-CONNECTED SOURCE SUBSTRATE AND DRAIN SUBSTRATE POWER MOSFETS

(75) Inventors: Christopher Boguslaw Kocon, Mountain Top, PA (US); Marie Denison, Plano, TX (US); Taylor Efland, Emerald Isle, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/563,923

(22) Filed: Aug. 1, 2012

(65) Prior Publication Data

US 2014/0197486 A1    Jul. 17, 2014

Related U.S. Application Data

(60) Provisional application No. 61/515,198, filed on Aug. 4, 2011.

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 27/088* | (2006.01) | |
| *H01L 29/78* | (2006.01) | |

(52) U.S. Cl.
CPC .......... *H01L 27/088* (2013.01); *H01L 29/7835* (2013.01)
USPC ............................ 257/337; 257/492; 257/493

(58) Field of Classification Search
CPC .............. H01L 29/407; H01L 29/0634; H01L 29/1095
USPC .......................................... 257/492, 493, 337
See application file for complete search history.

(56) References Cited

U.S. PATENT DOCUMENTS 8,754,497 B2 * 6/2014 Denison et al. ............... 257/492

* cited by examiner

*Primary Examiner* — Thien F Tran
(74) *Attorney, Agent, or Firm* — Jacqueline J. Garner; Frederick J. Telecky, Jr.

(57) ABSTRACT

A semiconductor device containing a high voltage MOS transistor with a drain drift region over a lower drain layer and channel regions laterally disposed at the top surface of the substrate. RESURF trenches cut through the drain drift region and body region parallel to channel current flow. The RESURF trenches have dielectric liners and electrically conductive RESURF elements on the liners. Source contact metal is disposed over the body region and source regions. A semiconductor device containing a high voltage MOS transistor with a drain drift region over a lower drain layer, and channel regions laterally disposed at the top surface of the substrate. RESURF trenches cut through the drain drift region and body region perpendicular to channel current flow. Source contact metal is disposed in a source contact trench and extended over the drain drift region to provide a field plate.

13 Claims, 11 Drawing Sheets

POWER INTEGRATED CIRCUIT INCLUDING SERIES-CONNECTED SOURCE SUBSTRATE AND DRAIN SUBSTRATE POWER MOSFETS

CROSS-REFERENCE TO RELATED APPLICATIONS

This application claims the benefit of, and incorporates by reference in its entirety, U.S. Provisional Application No. 61/515,198, filed Aug. 4, 2011.

FIELD OF THE INVENTION

This invention relates to the field of semiconductor devices. More particularly, this invention relates to high voltage MOS transistors in semiconductor devices.

BACKGROUND OF THE INVENTION

High voltage metal oxide semiconductor (MOS) transistors which operate at drain voltages higher than the maximum operating voltages of the gate dielectric layers of the transistors frequently include drift regions in the drains of the transistors. The drift regions provide voltage drops from the drain contact to the drain portion adjacent to the transistor channel regions, thereby reducing the voltages across the gate dielectric layers to values within the maximum operating voltages of the gate dielectric layers. Drift regions commonly have doping densities less than drain contact regions, and so undesirable increase the series resistances of the transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device, for example an integrated circuit or a discrete device, may include a high voltage MOS transistor which has a heavily doped lower drain layer in a substrate of the semiconductor device, a drain drift region above, and electrically connected to, the lower drain layer, a body region in the substrate contacting the drain drift region and extending to a top surface of the substrate, a lateral channel region in the body region at a top surface of the substrate, and a plurality of RESURF trenches extending from the top surface of the substrate. A source region abuts the channel region. Source contact metal is disposed over, and electrically connected to, the source region and body region. Drain contact metal may be directly electrically connected to the lower drain layer, and/or may be electrically coupled to the lower drain layer through vertical sinkers adjacent to, and laterally isolated from, the drain drift region, and which extend from the lower drain layer to a top surface of the substrate in which the transistor is formed. In one embodiment, the RESURF trenches may be parallel to a direction of current flow in the channel region. In another embodiment, the RESURF trenches may be perpendicular to the direction of current flow in the channel region, with drain contact metal extended over the drain drift region to provide a field plate.

DETAILED DESCRIPTION OF EXAMPLE EMBODIMENTS

Figure 1:
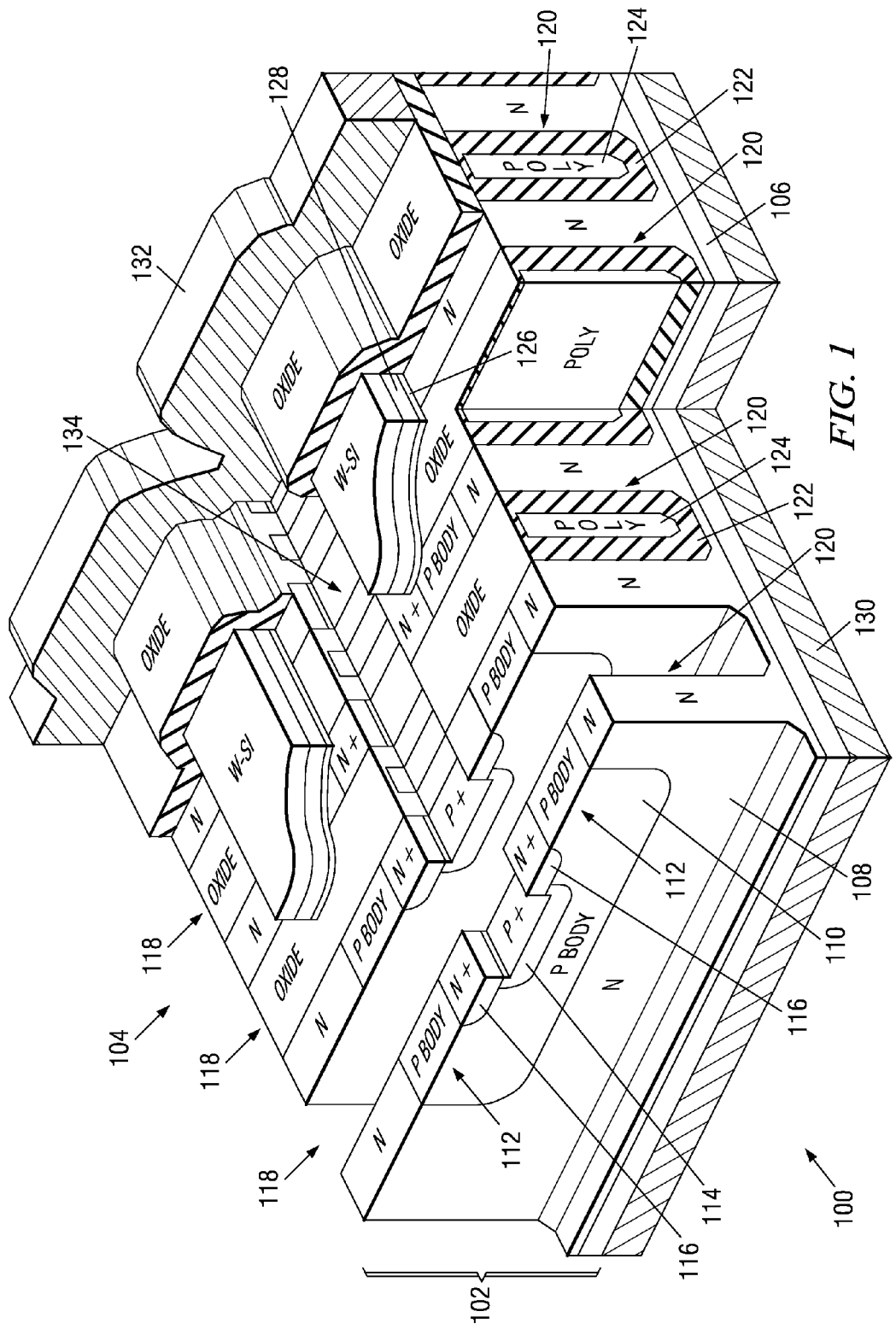
FIG. 1 is a perspective of a semiconductor device containing a high voltage MOS transistor according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "high voltage metal oxide semiconductor (MOS) transistor" will be understood to refer to an MOS transistor which is designed to operate with a higher drain voltage, relative to a source node of the transistor, than a maximum operating gate voltage, relative to a source node of the transistor. For example, a transistor which has a gate dielectric layer which provides a maximum gate voltage of 2.5 volts may be considered a high voltage transistor if it is designed to operate at a drain voltage of 10 volts.

For the purposes of this description, the term "RESURF" will be understood to refer to a material which reduces an electric field in an adjacent semiconductor region. In one example, a RESURF region may be a semiconductor region with an opposite conductivity type from the adjacent semiconductor region. In another example, a RESURF region may be a dielectric layer, possibly with an electrically conductive material on the dielectric layer opposite from the adjacent semiconductor region. RESURF structures are described in Appels, et. al., "Thin Layer High Voltage Devices" Philips J, Res. 35 1-13, 1980.

For the purposes of this description, the term "substantially" as applied to structures and elements formed in a semiconductor device is understood to mean within fabrication tolerances used to fabricate the semiconductor device.

A semiconductor device, for example an integrated circuit or a discrete device, may include a high voltage MOS transistor which has a heavily doped lower drain layer in a substrate of the semiconductor device, and a drain drift region above, and electrically connected to, the lower drain layer. A body region is disposed in the substrate contacting the drain drift region, so that the body region extends to a top surface of the substrate. A lateral channel region is disposed in the body region at a top surface of the body region. A plurality of RESURF trenches are disposed in the drift region, extending from the top surface of the drift region to a depth proximate to, or below, a top surface of the lower drain layer. A source region abuts the channel region. Source contact metal is disposed over, and electrically connected to, the source region and body region. Drain contact metal may be directly electrically connected to the lower drain layer, and/or may be electrically coupled to the lower drain layer through vertical sinkers adjacent to, and laterally isolated from, the drain drift region, and which extend from the lower drain layer to a top surface of the substrate in which the transistor is formed. In one embodiment, the RESURF trenches may be parallel to a direction of current flow in the channel region. In another embodiment, the RESURF trenches may be perpendicular to the direction of current flow in the channel region. In embodiments in which the semiconductor device is an integrated circuit, at least one additional transistor is disposed in and on the substrate. This description will describe embodiments of n-channel MOS transistors. It will be recognized that corresponding p-channel MOS transistors may be described with appropriate changes of conductivity types.

FIG. 1 is a perspective of a semiconductor device containing a high voltage MOS transistor according to an embodiment. The semiconductor device 100 is formed in and on a substrate 102 which may be a single crystal silicon wafer, but may be a silicon-on-insulator (SOI) wafer, a hybrid orientation technology (HOT) wafer with regions of different crystal orientations, or other appropriate material. The transistor 104 includes an n-type heavily doped lower drain layer 106 which has an average doping density greater than $1 \times 10^{19}$ cm$^{-3}$. In one version of the instant embodiment, the lower drain layer 106 may be at least 200 nanometers thick. In another version, the lower drain layer 106 may be at least one micron thick. In one version, the lower drain layer 106 may extend to a bottom surface of the substrate 102, as depicted in FIG. 1. In an alternate version, the substrate 102 may include material below a bottom surface of the lower drain layer 106.

An n-type drain drift region 108 is disposed above the lower drain layer 106 so as to be electrically connected to the lower drain layer 106. The drain drift region 108 may be disposed directly on the lower drain layer 106 as depicted in FIG. 1. An average doping density in the drain drift region 108 may be between $1 \times 10^{15}$ cm$^{-3}$ and $3 \times 10^{18}$ cm$^{-3}$. The drain drift region 108 extends to a top surface of the substrate 102.

A p-type body region 110 is disposed in the substrate 102 and extends to a top surface of the substrate 102, contacting the drain drift region 108. The body region 110 may have an average doping density between $1 \times 10^{14}$ cm$^{-3}$ and $1 \times 10^{17}$ cm$^{-3}$. Channel regions 112 are disposed at a top surface of the body region 110. The body region 110 may include a p-type body contact region 114 with an average doping density higher than $1 \times 10^{19}$ cm$^{-3}$. N-type source regions 116 abut the channel regions 112. The drain drift region 108 abuts the channel regions 112 opposite the source regions 116.

A plurality of RESURF trenches 118 cut through the drain drift region 108, body region 110 and source regions 116. Sidewalls 120 of the RESURF trenches 118 are substantially perpendicular to a boundary between the drain drift region 108 and the body region 110 at the top surface of the body region 110. The RESURF trenches 118 include RESURF dielectric liners 122 on sidewalls of the RESURF trenches 118. The RESURF dielectric liners 122 may be silicon dioxide, silicon nitride or a high-k dielectric which includes, for example, hafnium oxide or zirconium oxide. The RESURF dielectric liners 122 may be a single dielectric material or may include more than one layer of different dielectric materials. Electrically conductive RESURF conductive elements 124 are disposed on the RESURF dielectric liners 122. The RESURF conductive elements 124 may be, for example, polycrystalline silicon, commonly referred to as polysilicon. The RESURF dielectric liners 122 and RESURF conductive elements 124 have been removed from one of the RESURF trenches 118 in FIG. 1 to assist depiction of the spatial configuration of the body region 110 and source regions 116.

In one version of the instant embodiment, in which an operational drain voltage of the transistor 104 is between 30 and 50 volts, the RESURF trenches 118 may be between 2 and 3 microns deep and between 2 and 3 microns wide, with a spacing between adjacent RESURF trenches 118 of 3 to 5 microns. An average doping density of the drain drift region 108 between the RESURF trenches 118 may be between $1 \times 10^{16}$ cm$^{-3}$ and $3 \times 10^{16}$ cm$^{-3}$.

A gate dielectric layer 126 and a gate 128 are disposed over the channel regions 112. The gate 128 may include a layer of polysilicon and a layer of metal silicide, as depicted in FIG. 1. In other versions of the instant embodiment, the gate 128 may be primarily metal silicide, commonly referred to as a fully silicided gate, or may be a metal material, such as titanium nitride. Portions of the gate dielectric layer 126 and the gate 128 are removed from the transistor 104 in FIG. 1 to assist depiction of the spatial configuration of the body region 110 and source regions 116.

Drain contact metal 130 is electrically coupled to the lower drain layer 106. In versions of the instant embodiment in which the lower drain layer 106 extends to a bottom surface of the substrate 102, the drain contact metal 130 may be disposed at a bottom surface of the lower drain layer 106 in direct contact with the lower drain layer 106, as depicted in FIG. 1.

Source contact metal 132 is disposed over the body region 110 and makes electrical connection to the body region 110, possibly through the body contact region 114, if present. The source contact metal 132 also makes electrical connection to the source regions 116. In one version of the instant embodiment, a source contact trench 134 may be formed in the substrate 102, extending from the top surface of the substrate 102 down to the body region 110, through the body contact region 114 if present, and to the RESURF conductive elements 124, at a bottom surface of the source contact trench 134. The source contact trench 134 extends laterally in the source regions 116. The source contact metal 132 is formed in the source contact trench 134, so that the source contact metal 132 makes electrical coupling to the body region 110 and to the RESURF conductive elements 124 at the bottom surface of the source contact trench 134, and makes electrical coupling to the source regions 116 at sidewalls of the source contact trench 134.

The source contact metal 132 may be extended over the drain drift region 108 adjacent to the gate 128 to provide a field plate, as depicted in FIG. 1. A portion of the source contact metal 132 has been removed from the transistor 104 in FIG. 1 to assist depiction of the spatial configuration of the body region 110 and source regions 116. The source contact metal 132 may also be electrically coupled to the RESURF conductive elements 124, either directly, as depicted in FIG. 1, or through resistors (not shown in FIG. 1). In other versions of the instant embodiment, the RESURF conductive elements 124 may be electrically coupled to other bias sources.

During operation of the transistor 104, current flows through the channel regions 112 in a direction parallel to sidewalls of the RESURF trenches 118. In one version of the instant embodiment, charge in a depleted portion of the drain drift region 108 may be balanced, for example within 10 percent, by an opposite charge in the RESURF conductive elements 124.

Electrical resistivity of the RESURF conductive elements 124 may be adjusted to provide electrical resistance, for example at least 2 ohms, between the source contact metal 132 and lower portions of the RESURF conductive elements 124. In versions of the instant embodiment in which the RESURF conductive elements 124 include polysilicon, a doping density of the polysilicon may be adjusted to provide a desired resistance. Including resistance in series between the source contact metal 132 and the RESURF conductive elements 124 may advantageously reduce a recovery current in the source contact metal 132 when the transistor 104 is switched off.

Figure 2:
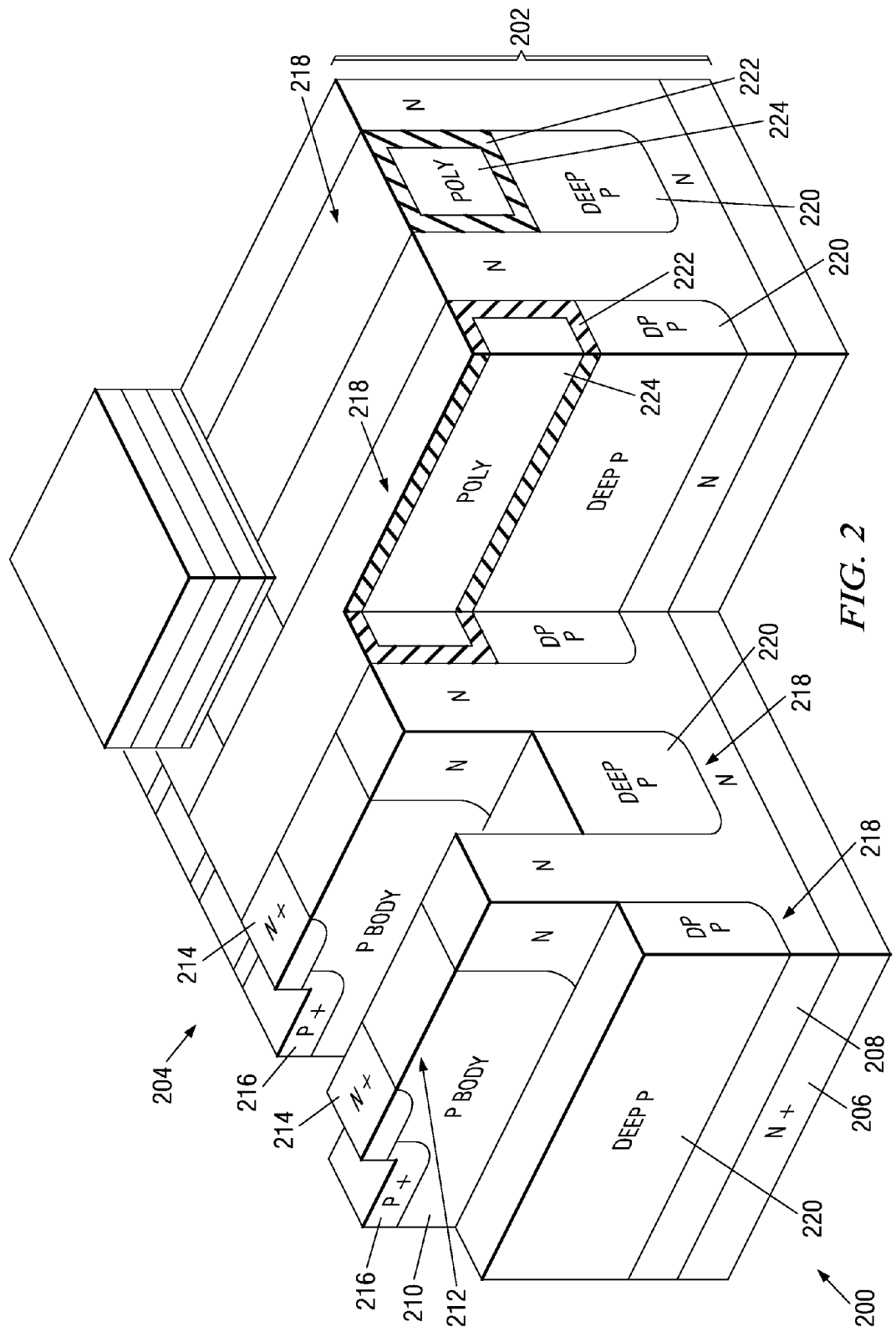
FIG. 2 is a perspective of a semiconductor device containing a high voltage MOS transistor according to another embodiment.

FIG. 2 is a perspective of a semiconductor device containing a high voltage MOS transistor according to another embodiment. The semiconductor device 200 is formed in and on a substrate 202, for example, as described in reference to FIG. 1. The transistor 204 includes an n-type heavily doped lower drain layer 206 and an n-type drain drift region 208 disposed above the lower drain layer 206, as described in reference to FIG. 1. A p-type body region 210, channel regions 212, n-type source regions 214, and possibly body contact regions 216 are disposed in the substrate 202 as described in reference to FIG. 1.

A plurality of RESURF trenches 218 cut through the drain drift region 208, body region 210 and source regions 214. The RESURF trenches 218 include p-type RESURF semiconductor regions 220 disposed in bottom portions of the RESURF trenches 218, and RESURF dielectric liners 222 and RESURF conductive elements 224 in upper portions of the RESURF trenches 218. The RESURF dielectric liners 222 are disposed on sidewalls of the RESURF trenches 218 in the upper portion of the RESURF trenches 218, and between the RESURF semiconductor regions 220 and the RESURF conductive elements 224. During operation of the transistor 204, current flows through the channel regions 212 in a direction parallel to sidewalls of the RESURF trenches 218.

Figure 3:
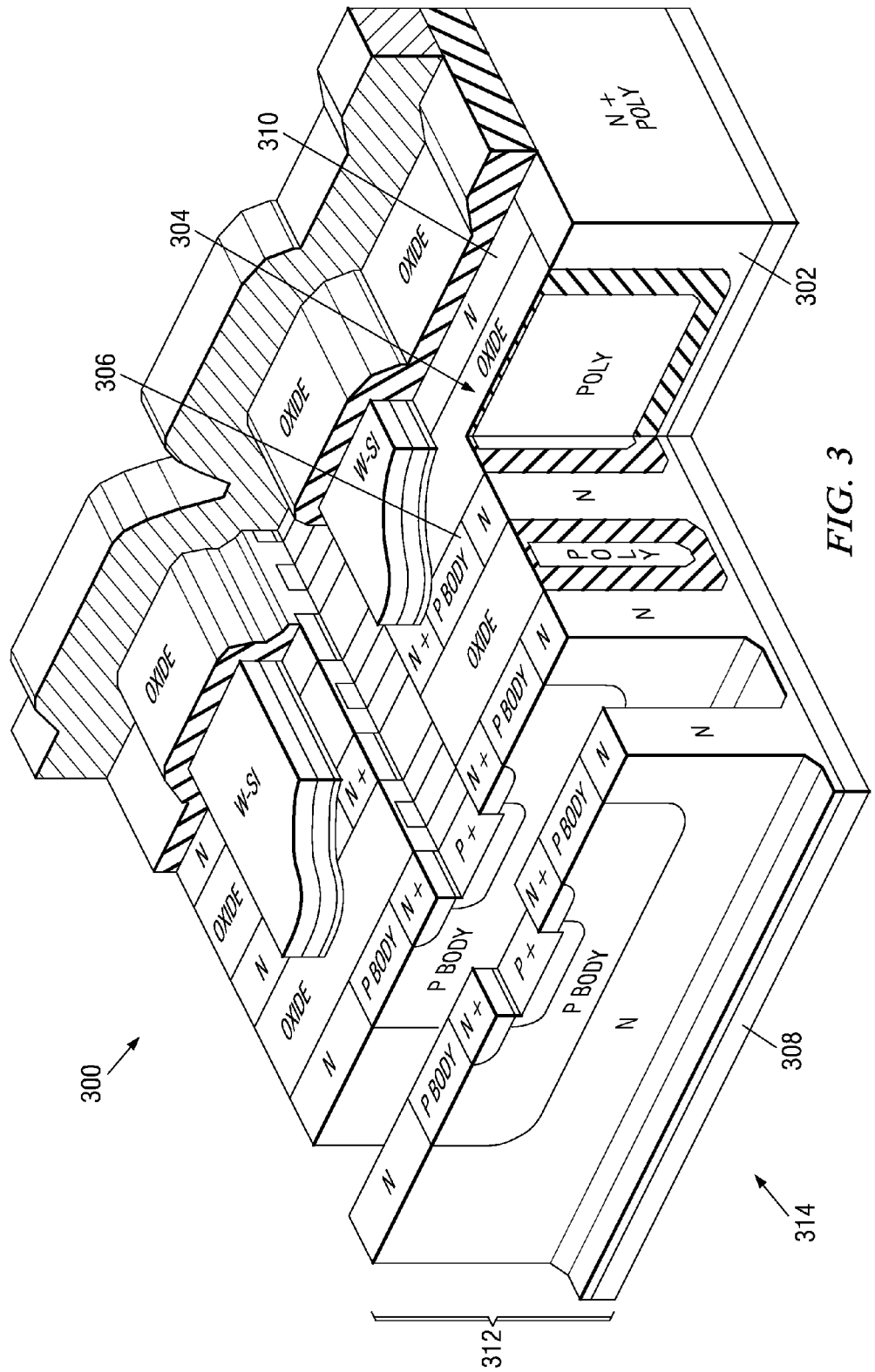
FIG. 3 is a perspective of a semiconductor device containing a high voltage MOS transistor according to a further embodiment.

FIG. 3 is a perspective of a semiconductor device containing a high voltage MOS transistor according to a further embodiment. The transistor 300 is configured as described in reference to FIG. 1 or FIG. 2. The transistor 300 further includes n-type vertical heavily doped drain risers 302 adjacent to RESURF trenches 304 opposite a body region 306. The drain risers 302 extend downward to a heavily doped lower drain layer 308, and may extend upward to a top surface of a drain drift region 310. The drain risers 302 may be doped portions of a substrate 312 of the semiconductor device 314, or may be backfilled regions of, for example, doped polysilicon, as depicted in FIG. 3. The drain risers 302 have an average doping density greater than $1\times10^{19}$ cm$^{-3}$. The drain risers 302 are not directly contacted by drain contact metal at a top surface of the drain risers 302.

In one version of the instant embodiment, the drain risers 302 laterally abut the RESURF trenches 304 as depicted in FIG. 3. In other versions, the drain risers 302 are laterally separated from the RESURF trenches 304 by a portion of the drain drift region 310, for example, by a separation between 0.5 and 3 microns.

Figure 4:
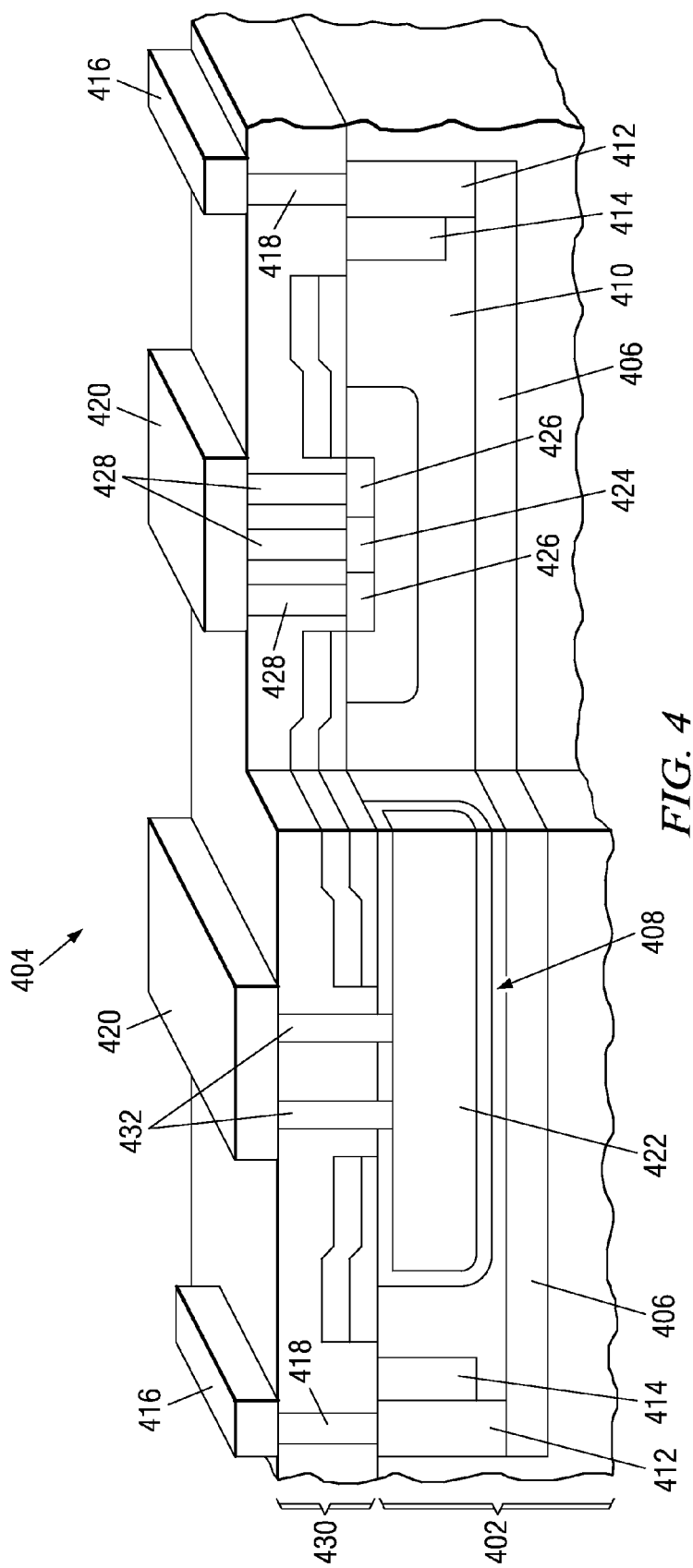
FIG. 4 is a perspective of a semiconductor device containing a high voltage MOS transistor according to an alternate embodiment.

FIG. 4 is a perspective of a semiconductor device containing a high voltage MOS transistor according to an alternate embodiment. The semiconductor device 400 is formed in and on a substrate 402 which may be a single crystal silicon wafer, an SOI wafer, or other semiconductor substrate. The transistor 404 may be configured according to any of the embodiments discussed in reference to FIG. 1 through FIG. 3. In the instant embodiment, the lower drain layer 406 extends laterally past the RESURF trenches 408 and the drain drift region 410. Heavily doped n-type drain sinkers 412 are disposed at a periphery of the transistor 404 making contact to the lower drain layer 406, and are laterally separated from the RESURF trenches 408 and the drain drift region 410 by dielectric isolation elements 414. The dielectric isolation elements 414 may be for example, shallow trench isolation or deep trench isolation. In one version of the instant embodiment, the drain sinkers 412 may have an average doping density greater than $1\times10^{19}$ cm$^{-3}$. The drain sinkers 412 contact, and provide an electrical connection to, the lower drain layer 406. The drain sinkers 412 may be electrically coupled to drain contact metal 416 at a top surface of the drain sinkers 412, for example through first metal contacts 418 as depicted in FIG. 4. The drain sinkers 412 may be configured in a continuous manner or in laterally separated regions. Providing topside drain metal connection to the lower drain layer 406 through the drain sinkers 412 may advantageously allow fabrication of the transistor 404 using planar processing methods.

FIG. 4 also depicts an alternate configuration of source contact metal 420 coupled to a body contact region 424 and source regions 426 through second metal contacts 428. The first metal contacts 418 and second metal contacts 428 may be disposed in a pre-metal dielectric layer 430. The second metal contacts 428 may be formed concurrently with the first metal contacts 418.

The source contact metal 420 may be electrically coupled to RESURF conductive elements 422 through contacts 432 disposed in the pre-metal dielectric layer 430. In one version of the instant embodiment, the contacts 432 to the RESURF conductive elements 422 may have impedances of at least 2 ohms. Including resistance in series between the source contact metal 420 and the RESURF conductive elements 422 may advantageously reduce a recovery current in the source contact metal 420 when the transistor 404 is switched off.

Figure 5:
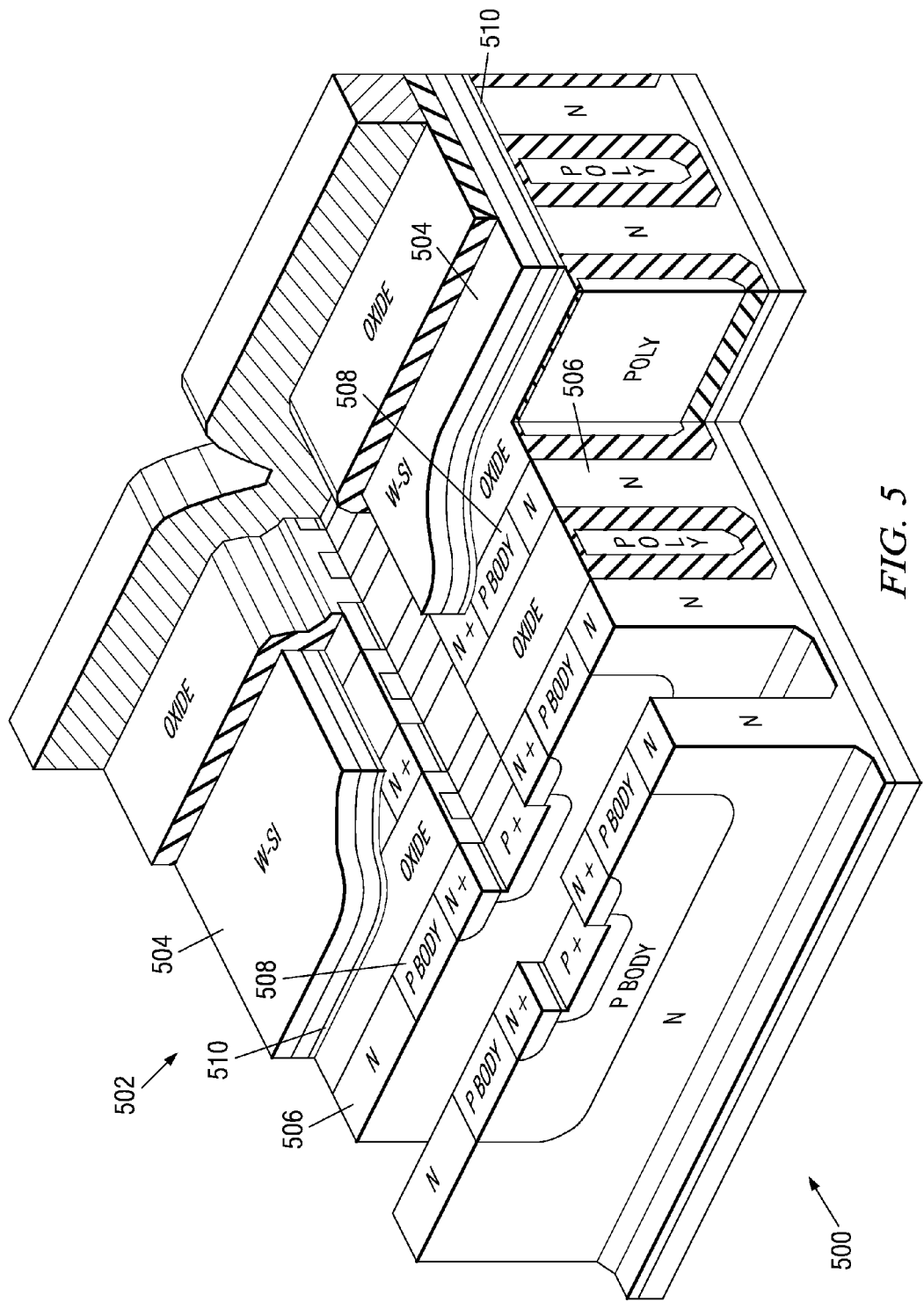
FIG. 5 is a perspective of a semiconductor device containing a high voltage MOS transistor according to another embodiment.

FIG. 5 is a perspective of a semiconductor device 500 containing a high voltage MOS transistor 502 according to another embodiment. A gate 504 of the transistor 502 is extended over a drain drift region 506 abutting a body region 508, so as to provide a field plate over the drain drift region 506. In the instant embodiment, a gate dielectric layer 510 provides electrical isolation between the gate 504 and the drain drift region 506. Portions of the gate dielectric layer 510 and the gate 504 are removed from the transistor 502 in FIG. 5 to assist depiction of the spatial configuration of the body region 508 and drain drift region 506.

Figure 6:
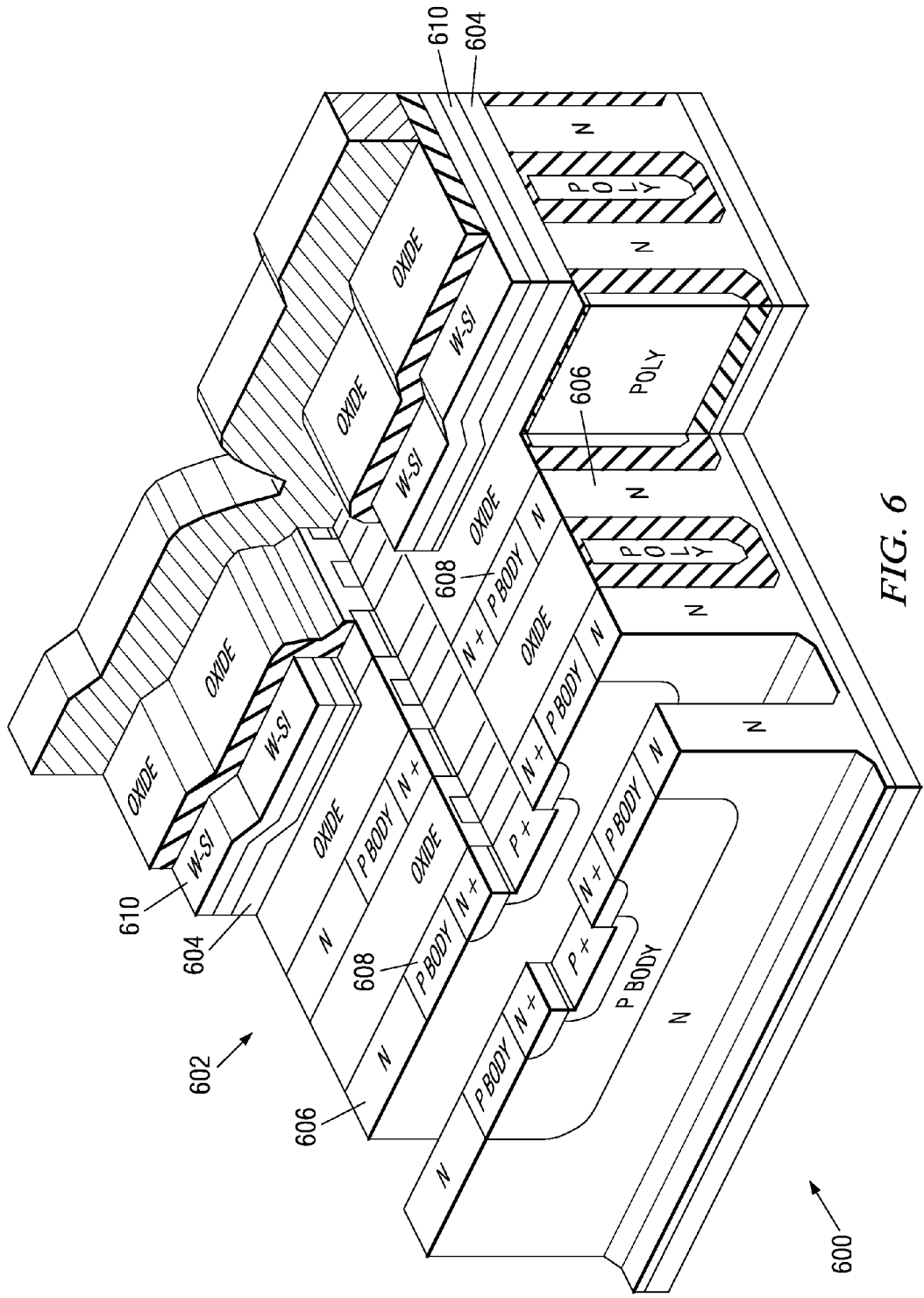
FIG. 6 is a perspective of a semiconductor device containing a high voltage MOS transistor according to a further embodiment.

FIG. 6 is a perspective of a semiconductor device 600 containing a high voltage MOS transistor 602 according to a further embodiment. A field plate dielectric layer 604 is disposed over a drain drift region 606 adjacent to abutting a body region 608. A gate 610 of the transistor 602 is extended over the drain drift region 606, separated from the drain drift region 606 by the field plate dielectric layer 604, so as to provide a field plate over the drain drift region 606. Portions of the field plate dielectric layer 604 and the gate 610 are removed from the transistor 602 in FIG. 6 to assist depiction of the spatial configuration of the body region 608 and drain drift region 606.

Figure 7:
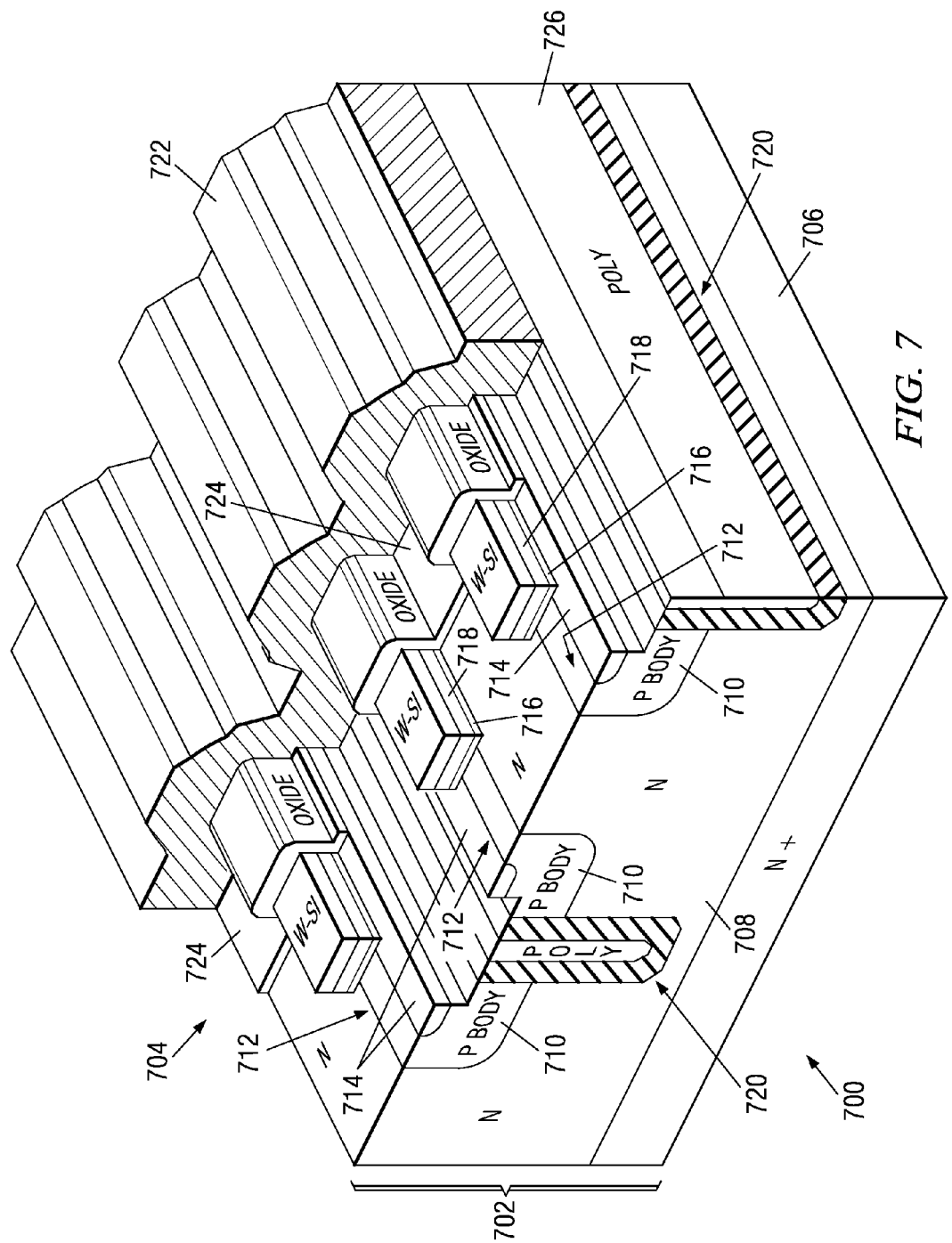
FIG. 7 is a perspective of a semiconductor device containing a high voltage MOS transistor with RESURF trenches configured according to an alternate embodiment.

FIG. 7 is a perspective of a semiconductor device containing a high voltage MOS transistor with RESURF trenches configured according to an alternate embodiment. The semiconductor device 700 is formed in and on a substrate 702, for example, as described in reference to FIG. 1. The transistor 704 includes an n-type heavily doped lower drain layer 706 as described in reference to FIG. 1. An n-type drain drift region 708 is disposed over the lower drain layer 706. A p-type body region 710 is disposed in the substrate 702 contacting the drain drift region 708. Channel regions 712 are disposed at a top surface of a body region 710. N-type source regions 714 are disposed in the substrate 702 abutting the channel regions 712 opposite the drain drift region 708. During operation of the transistor 704, channel current flows in the channel regions 712 in a direction perpendicular to a boundary between the drain drift region 708 and the channel regions 712. A gate dielectric layer 716 and a gate 718 are disposed over the channel regions 712. RESURF trenches 720 cut through the body region 710 and the drain drift region 708 perpendicular to the direction of channel current flow in the channel regions 712. The RESURF trenches 720 may be configured as described in reference to FIG. 1 and/or FIG. 2. Source contact metal 722 is disposed above the RESURF trenches 720, the source regions 714, the body region 710 and the drain drift region 708, and makes electrical connections to the source regions 714 and the body region 710. The source contact metal 722 is separated from the drain drift region 708 by a field plate dielectric layer 724, so as to provide a field plate to the drain drift region 708. Portions of the field plate dielectric layer 724, the gate dielectric layer 716 and the gate 718 are removed from the transistor 704 in FIG. 7 to assist depiction of the spatial configuration of the body region 710 and drain drift region 708. The transistor 704 may have drain sinkers around a periphery of the transistor 704 as described in reference to FIG. 4. The source contact metal 722 may be electrically coupled to RESURF conductive elements 726 in the RESURF trenches, for example either directly as depicted in FIG. 7 or through resistors, not shown in FIG. 7, as described in reference to FIG. 4.

Figure 8:
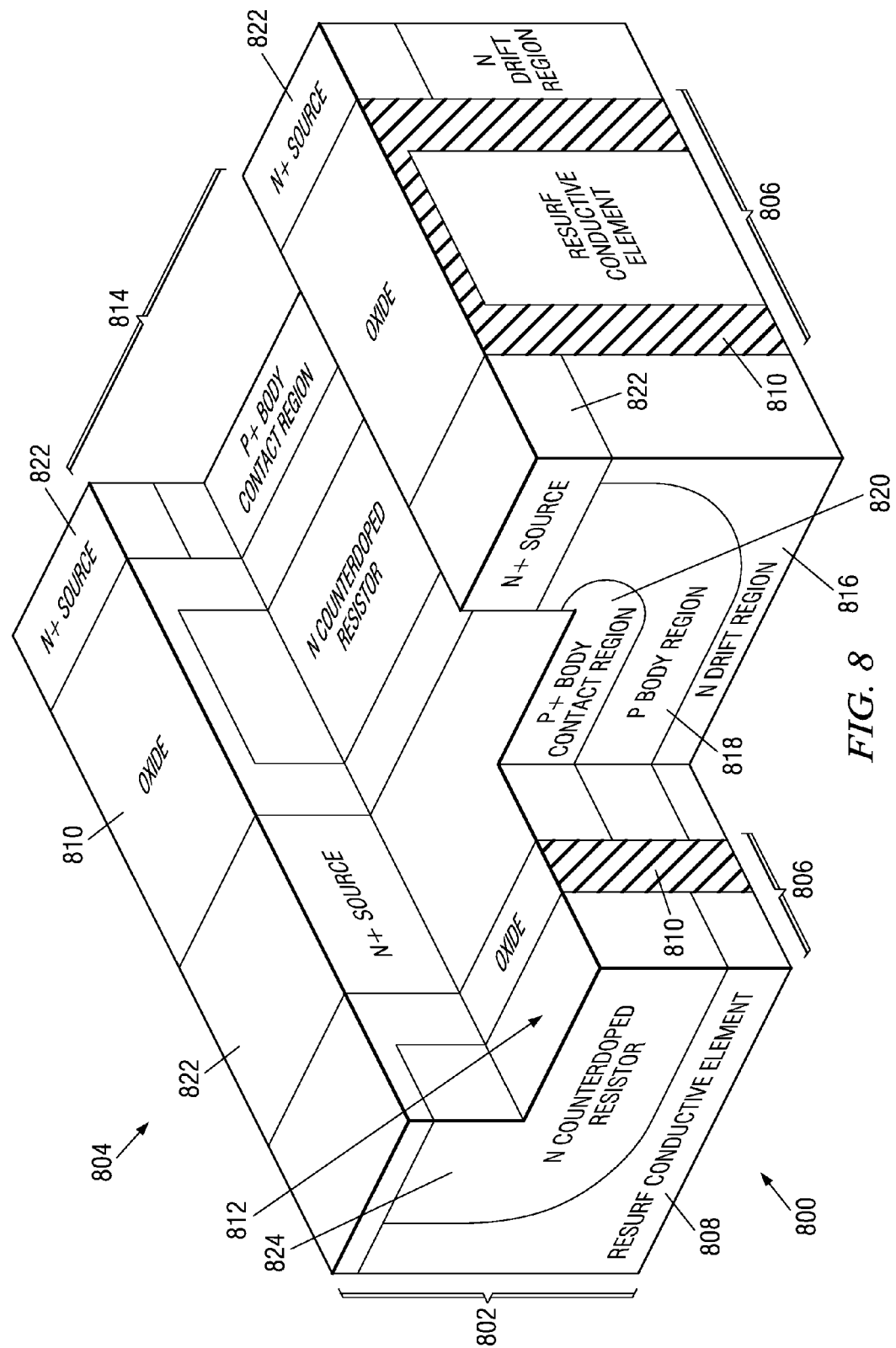
FIG. 8 is a perspective of a semiconductor device containing a high voltage MOS transistor with resistors in series between source contact metal and RESURF conductive elements, according to an embodiment.

FIG. 8 is a perspective of a semiconductor device containing a high voltage MOS transistor with resistors in series between source contact metal and RESURF conductive elements, according to an embodiment. The semiconductor device 800 is formed in and on a substrate 802, for example, as described in reference to FIG. 1. The transistor 804, a portion of which is depicted in FIG. 8, has RESURF trenches 806 with RESURF conductive elements 808 on RESURF dielectric liners 810 are disposed in the substrate 802. The RESURF conductive elements 808 are exposed to a top surface of the substrate 802 at RESURF contact areas 812 in a source contact trench 814, as described in reference to FIG. 1.

N-type drain drift regions 816 are disposed in the substrate 802 between adjacent RESURF trenches 806, as described in reference to FIG. 1. P-type body regions 818 are disposed in the drain drift regions 816 at the source contact trench 814, as described in reference to FIG. 1. Heavily doped p-type body contact regions 820 are disposed in the body regions 818 at a bottom surface of the source contact trench 814. N-type source regions 822 are disposed in the drain drift regions 816 and the body regions 818 at sidewalls of the source contact trench 814, as described in reference to FIG. 1.

In the instant embodiment, the RESURF conductive elements 808 may be formed primarily of n-type polysilicon with an average doping density above $1 \times 10^{19}$ cm$^{-3}$. Counterdoped resistors 824 are disposed in the RESURF conductive elements 808 at the RESURF contact areas 812 with resistances of at least 2 ohms. A conductivity type of the counterdoped resistors 824 is the same the RESURF conductive elements 808, which is n-type in the instant embodiment. The counterdoped resistors 824 may be formed by ion implanting p-type dopants such as boron or gallium into the RESURF conductive elements 808 at the RESURF contact areas 812 after the source contact trench 814 is formed. In one version of the instant embodiment, the counterdoped resistors 824 may be formed concurrently with the body regions 818 and/or the body contact regions 820.

Source metal, not shown in FIG. 8, is disposed in the source contact trench 814, as described in reference to FIG. 1, so as to make electrical contact with the counterdoped resistors 824, the body contact regions 820 and the source regions 822. The counterdoped resistors 824 provide series resistance between the source metal and the RESURF conductive elements 808.

Figure 9:
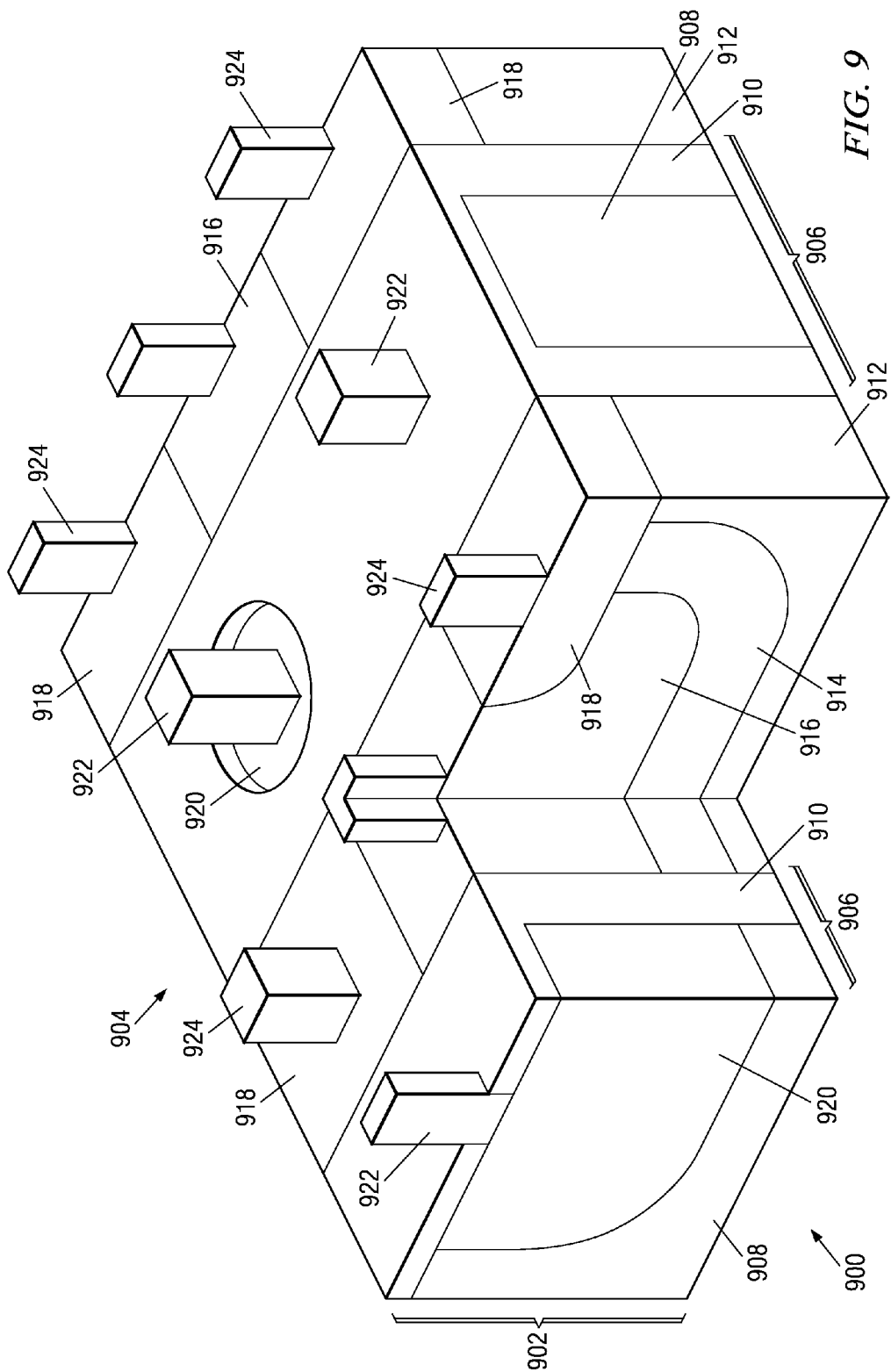
FIG. 9 is a perspective of a semiconductor device containing a high voltage MOS transistor with resistors in series between source contact metal and RESURF conductive elements, according to another embodiment.

FIG. 9 is a perspective of a semiconductor device containing a high voltage MOS transistor with resistors in series between source contact metal and RESURF conductive elements, according to another embodiment. The semiconductor device 900 is formed in and on a substrate 902, for example, as described in reference to FIG. 1. The transistor 904, a portion of which is depicted in FIG. 9, has RESURF trenches 906 with RESURF conductive elements 908 on RESURF dielectric liners 910 are disposed in the substrate 902. The RESURF dielectric liners 910 are further disposed over top surfaces of the RESURF conductive elements 908 and extend to a top surface of the substrate 902. N-type drain drift regions 912 are disposed in the substrate 902 between adjacent RESURF trenches 906, as described in reference to FIG. 1. P-type body regions 914 are disposed in the drain drift regions 912 at the top surface of the substrate 902. Heavily doped p-type body contact regions 916 are disposed in the body regions 914 at the top surface of the substrate 902. N-type source regions 918 are disposed in the drain drift regions 912 and the body regions 914 at the top surface of the substrate 902.

In the instant embodiment, the RESURF conductive elements 908 may be formed primarily of n-type polysilicon with an average doping density above $1 \times 10^{19}$ cm$^{-3}$. Counterdoped resistors 920 are disposed in the RESURF conductive elements 908 at the top surfaces of the RESURF conductive elements 908 with resistances of at least 2 ohms. A conductivity type of the counterdoped resistors 920 is the same the RESURF conductive elements 908, which is n-type in the instant embodiment. The counterdoped resistors 920 may be formed by ion implanting p-type dopants such as boron or gallium into the RESURF conductive elements 908 through the RESURF dielectric liners 910. In one version of the instant embodiment, the counterdoped resistors 920 may be formed concurrently with the body regions 914 and/or the body contact regions 916.

A first set of contacts 922 are disposed on the counterdoped resistors 920 through the RESURF dielectric liners 910 disposed over the top surfaces of the RESURF conductive elements 908 and make electrical contact the counterdoped resistors 920. A portion of the RESURF dielectric liners 910 around an instance of the first set of contacts 922 has been removed in FIG. 9 to clarify the condition of electrical contact between the first set of contacts 922 and the counterdoped resistors 920.

A second set of contacts 924 is disposed on top surfaces of the source regions 918 and make electrical contact to the source regions 918. A third set of contacts 926 is disposed on surfaces of the body contact regions 916 and make electrical contact to the body contact regions 916. The first set of contacts 922, the second setoff contacts 924 and the third set of contacts 926 may be formed concurrently, for example, by etching contact holes through a pre-metal dielectric layer, not shown, to expose top surfaces of the counterdoped resistors 920, source regions 918 and body contact regions 916. The contact holes may be subsequently filled with contact metal, such as a titanium liner, a titanium nitride barrier layer and tungsten fill metal.

Figure 10:
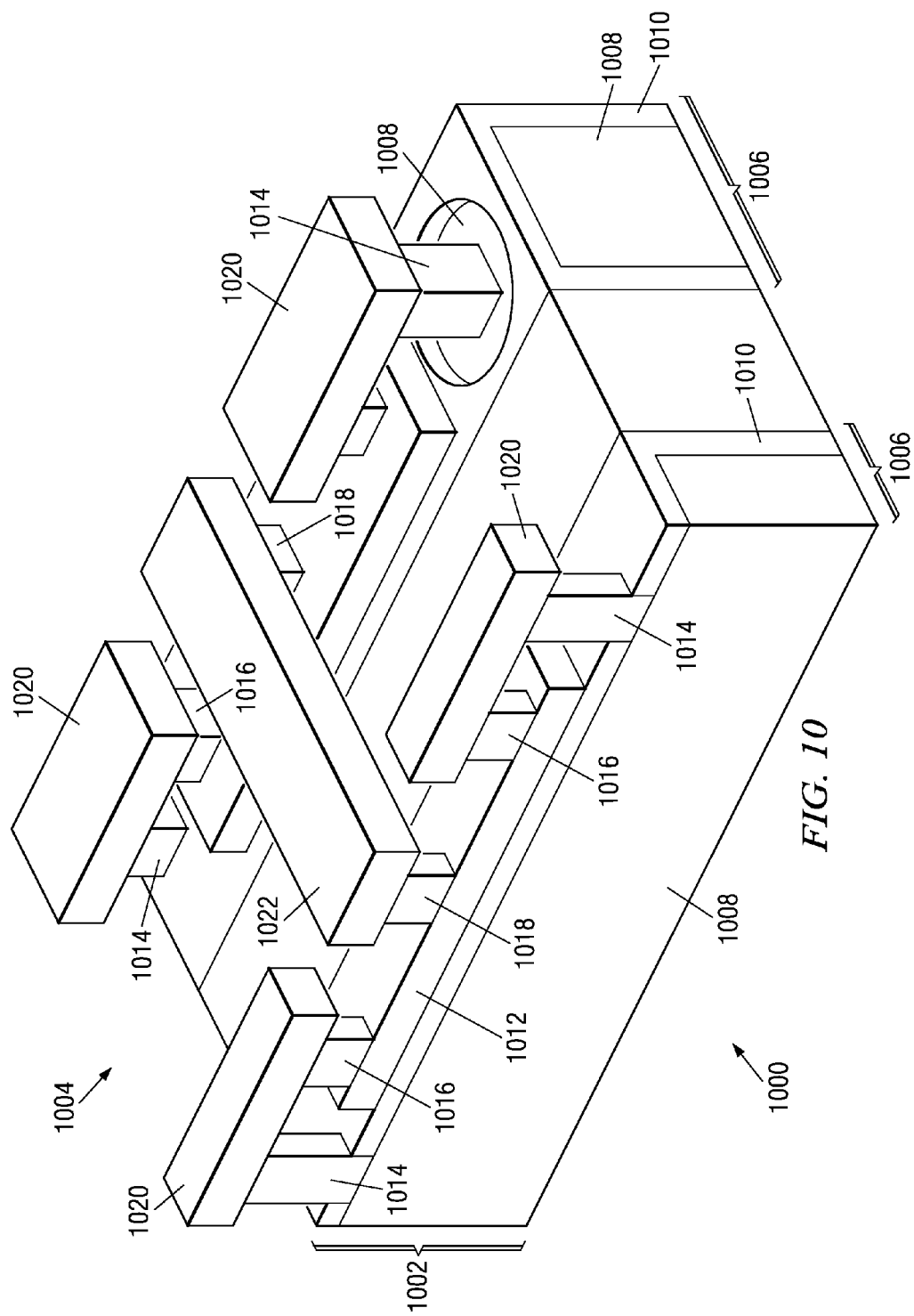
FIG. 10 is a perspective of a semiconductor device containing a high voltage MOS transistor with resistors in series between source contact metal and RESURF conductive elements, according to a further embodiment.

FIG. 10 is a perspective of a semiconductor device containing a high voltage MOS transistor with resistors in series between source contact metal and RESURF conductive elements, according to a further embodiment. The semiconductor device 1000 is formed in and on a substrate 1002, for example, as described in reference to FIG. 1. The transistor 1004, a portion of which is depicted in FIG. 10, has RESURF trenches 1006 with RESURF conductive elements 1008 on RESURF dielectric liners 1010 are disposed in the substrate 1002. The RESURF dielectric liners 1010 are further disposed over top surfaces of the RESURF conductive elements 1008 and extend to a top surface of the substrate 1002.

Resistors 1012 are disposed over the top surface of the substrate 1002, for example on the RESURF dielectric liners 1010 disposed over top surfaces of the RESURF conductive elements 1008. The resistors 1012 may be formed, for example, of gate material such as a lower layer of polysilicon and an upper layer of metal silicide. In an alternate version of the instant embodiment, the resistors 1012 may include a layer of polysilicon with a layer of silicide block dielectric, such as silicon nitride, over a resistor body portion of the resistors 1012. Resistors 1012 formed of other materials are within the scope of the instant embodiment.

A first set of contacts 1014 are disposed on the RESURF conductive elements 1008 through the RESURF dielectric liners 1010 disposed over the top surfaces of the RESURF conductive elements 1008 and make electrical contact the RESURF conductive elements 1008. A portion of the RESURF dielectric liners 1010 around an instance of the first set of contacts 1014 has been removed in FIG. 10 to clarify the condition of electrical contact between the first set of contacts 1014 and the RESURF conductive elements 1008.

A second set of contacts 1016 is disposed on top surfaces of the resistors 1012 at RESURF ends of the resistors 1012 and make electrical contact to the resistors 1012. A third set of contacts 1018 is disposed on top surfaces of the resistors 1012 at bias ends of the resistors 1012 and make electrical contact to the resistors 1012. Resistance values of the resistors 1012 between the second set of contacts 1016 and the third set of contacts 1018 are at least 2 ohms. The first set of contacts 1014, the second setoff contacts 1016 and the third set of contacts 1018 may be formed concurrently, for example, by etching contact holes through a pre-metal dielectric layer, not shown, to expose top surfaces of the RESURF conductive elements 1008, RESURF ends of the resistors 1012 and bias ends of the resistors 1012. The contact holes may be subsequently filled with contact metal, such as a titanium liner, a titanium nitride barrier layer and tungsten fill metal.

A first set of metal interconnects 1020 is disposed on the first set of contacts 1014 and second set of contacts 1016 so as to provide electrical connections between corresponding pairs of the first set of contacts 1014 and second set of contacts 1016. A second set of metal interconnects 1022 is disposed on the third set of contacts 1018, possibly configured so that one instance of the second set of metal interconnects 1022 is disposed on more than one instance of the third set of contacts 1018. The second set of metal interconnects 1022 are coupled to a RESURF bias source, not shown. The first set of metal interconnects 1020, the second set of metal interconnects 1022, the first set of contacts 1014, the second setoff contacts 1016 and the third set of contacts 1018 provide electrical paths from the RESURF bias source through the resistors 1012 to the RESURF conductive elements 1008. In one version of the instant embodiment, the second set of metal interconnects 1022 may be directly connected to, or may be part of, source contact metal.

Figure 11:
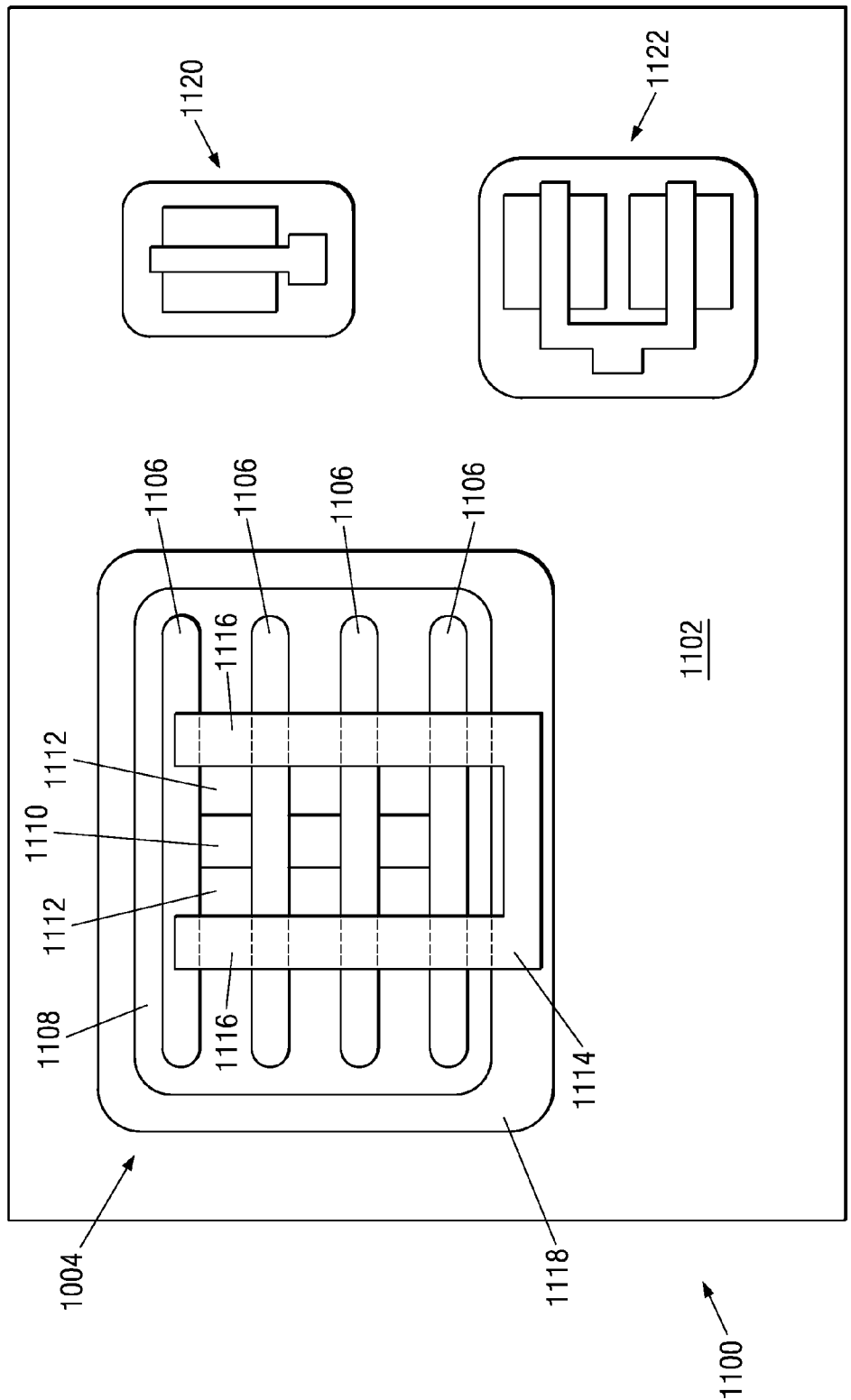
FIG. 11 is a top view of a semiconductor device containing a high voltage MOS transistor according to an embodiment.

FIG. 11 is a top view of a semiconductor device containing a high voltage MOS transistor according to an embodiment. The semiconductor device 1100 is formed on a substrate 1102, for example, as described in reference to FIG. 1 through FIG. 7. The high voltage MOS transistor 1104 includes RESURF trenches 1106 disposed in a drain drift region 1108, cutting through a body region 1110 and source regions 1112, as described in reference to FIG. 1. A gate 1114 is disposed over channel region 1116 in the body region 1110. The high voltage MOS transistor 1104 may be surrounded by an isolation dielectric region 1118, for example shallow trench isolation or deep trench isolation. Source contact metal for the high voltage MOS transistor 1104 is not depicted in FIG. 11, to assist depiction of the spatial configuration of the RESURF trenches 1106, the drain drift region 1108, the body region 1110, the source regions 1112, and the gate 1114.

The semiconductor device 1100 further includes at least one additional transistor 1120, and may also include logic circuitry, depicted schematically in FIG. 11 as a complementary metal oxide semiconductor (CMOS) inverter 1122. Interconnect metallization for the transistor 1120 and CMOS inverter 1122 is not depicted in FIG. 11.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A semiconductor device, comprising:
a semiconductor substrate;
a high voltage metal oxide semiconductor (MOS) transistor, including:
a heavily doped lower drain layer in said substrate, said lower drain layer having a first conductivity type with an average doping density greater than $1 \times 10^{19}$ cm$^{-3}$;

a drain drift region disposed over said lower drain layer, said drain drift region having said first conductivity type with an average doping density between $1\times10^{15}$ cm$^{-3}$ and $3\times10^{18}$ cm$^{-3}$;

a body region disposed in said substrate extending to a top surface of said substrate and contacting said drain drift region, said body region having a second conductivity type opposite from said first conductivity type;

channel regions in said body region at a top surface of said body region abutting said drain drift region;

source regions in said substrate abutting said channel regions opposite from said drain drift region, said source regions having said first conductivity type, so that channel current in said channel flows in a direction perpendicular to a boundary between said drain drift region and said channel regions;

a gate dielectric layer over said channel regions;

a gate over said gate dielectric layer;

a plurality of RESURF trenches in said substrate cutting through said drain drift region, said body region and said source regions, so that sidewalls of said RESURF trenches are parallel to said direction of channel current flow within fabrication tolerances used to form said semiconductor device, said RESURF trenches including:
    RESURF dielectric liners on said sidewalls of said RESURF trenches; and
    electrically conductive RESURF conductive elements on said RESURF dielectric liners;

source contact metal disposed over said body region, said source contact metal being electrically connected to said body region and said source regions; and drain contact metal, said drain contact metal being electrically connected to said lower drain layer.

2. The semiconductor device of claim 1, in which said source contact metal is disposed in a source contact trench in said substrate, such that:
    said source contact trench extends from said top surface of said substrate down to said body region and to said RESURF conductive elements, so that said source contact metal makes electrical contact to said body region and to said RESURF conductive elements at a bottom surface of said source contact trench; and
    said source contact trench extends laterally to said source regions, so that said source contact metal makes electrical contact to said source regions at sidewalls of said source contact trench.

3. The semiconductor device of claim 1, in which:
    said lower drain layer extends to a bottom surface of said substrate; and
    said drain contact metal is disposed at a bottom surface of said lower drain layer in direct contact with said lower drain layer.

4. The semiconductor device of claim 1, in which said RESURF trenches further include RESURF semiconductor regions of said second conductivity type disposed in bottom portions of said RESURF trenches, so that said RESURF dielectric liners are disposed between said RESURF semiconductor regions and said RESURF conductive elements.

5. The semiconductor device of claim 1, further including vertical heavily doped drain risers in said substrate adjacent to said RESURF trenches opposite from said body region, said drain risers laterally contacting said drain drift region and extending from said lower drain layer to a top surface of said drain drift region, said drain risers having said first conductivity type with an average doping density greater than $1\times10^{19}$ cm$^{-3}$, such that said drain risers are free of direct contact to said drain contact metal.

6. The semiconductor device of claim 5, in which said drain risers are laterally separated from said RESURF trenches by a distance between 0.5 microns and 3 microns.

7. The semiconductor device of claim 1, in which:
    said lower drain layer extends laterally past said RESURF trenches and said drain drift region;
    heavily doped drain sinkers are disposed at a periphery of said transistor and making contact with said lower drain layer, said drain sinkers being laterally separated from said RESURF trenches and said drain drift region by dielectric isolation elements, said drain sinkers having said first conductivity type with an average doping density greater than $1\times10^{19}$ cm$^{-3}$; and
    said drain contact metal is disposed over said drain sinkers such that said drain sinkers are electrically coupled to said drain contact metal.

8. The semiconductor device of claim 1, in which said gate is extended over said drain drift region, said gate being separated from a top surface of said drain drift region by a field plate dielectric layer.

9. The semiconductor device of claim 1, in which said source contact metal is extended over said drain drift region, said source contact metal being separated from a top surface of said drain drift region by a field plate dielectric layer.

10. The semiconductor device of claim 9, in which said RESURF conductive elements are electrically coupled to said source contact metal through resistors having impedances of at least 2 ohms.

11. The semiconductor device of claim 1, in which said RESURF conductive elements are electrically coupled to said source contact metal.

12. The semiconductor device of claim 1, further including a second transistor in said substrate.

13. The semiconductor device of claim 1, in which:
    said RESURF trenches are between 2 and 3 microns deep and between 2 and 3 microns wide, with a spacing between adjacent said RESURF trenches of 3 to 5 microns; and
    an average doping density of said drain drift region between said RESURF trenches is between $1\times1016$ cm-3 and $3\times1016$ cm-3.

* * * * *